United States Patent [19]
Khoury

[11] Patent Number: 4,959,623
[45] Date of Patent: Sep. 25, 1990

[54] LOW IMPEDANCE BUFFER CIRCUIT

[75] Inventor: John M. Khoury, New Providence, N.J.

[73] Assignee: AT&T Bell Laboratories, Murray Hill, N.J.

[21] Appl. No.: 382,162

[22] Filed: Jul. 19, 1989

[51] Int. Cl.$^5$ .............................................. H03F 3/26
[52] U.S. Cl. ................................... 330/265; 330/264; 330/268
[58] Field of Search ............... 330/262, 263, 264, 265, 330/267, 268, 307

[56] References Cited

U.S. PATENT DOCUMENTS

4,306,199  12/1981  Kondou .............................. 330/268

OTHER PUBLICATIONS

Paul R. Gray and Robert G. Meyer, *Analysis and Design of Analog Intergrated Circuits*, Second Edition (1984), pp. 757-760.

Primary Examiner—Steven Mottola
Attorney, Agent, or Firm—David I. Caplan

[57] ABSTRACT

A low impedance class AB buffer stage in complementary transistor technology has its quiescent current stabilized and its operation thereby made more reliable by means of suitable error op-amps that are supplied with transistor feedback loops which are connected to the stage's output terminal through resistors. In addition, for full rail-to-rail output voltage capability, transistor switching devices are added to turn off current through either of the resistors when the output voltage approaches the voltage of either power rail, and also a pair of serially rail-to-rail connected transistor is connected in parallel with the feedback loops.

13 Claims, 1 Drawing Sheet

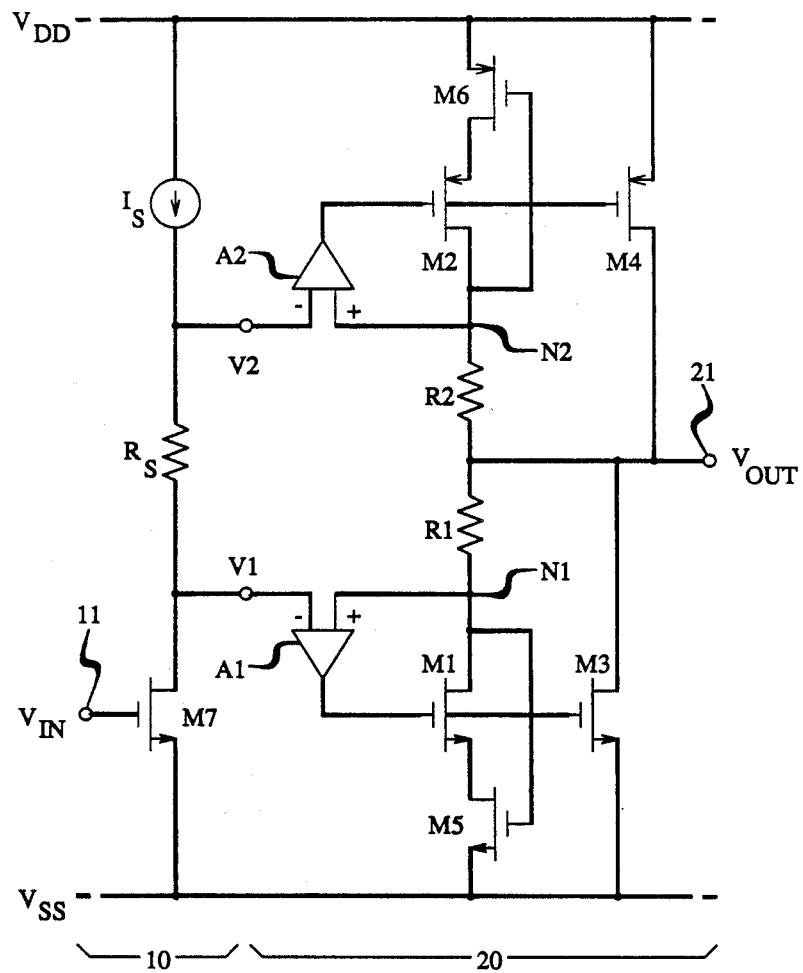

LOW IMPEDANCE BUFFER CIRCUIT

FIELD OF INVENTION

This invention relates to amplifier circuitry and more particular to such circuitry having a low output impedance.

BACKGROUND OF THE INVENTION

Amplifier circuitry having relatively low output impedance is necessary for driving large capacitive or resistive loads, such as the relatively low impedance of a telephone line, typically an impedance of about 600 ohms or less. In prior art, such amplifier circuitry typically is composed of a low impedance unity-gain buffer output stage fed by one or more voltage-gain stages. This amplifier circuitry typically is integrated in a semiconductor chip; whereas the load is situated off-chip.

For example, as shown in the textbook by P. R. Gray and R. G. Meyer, *Analysis and Design of Analog Integrated Circuits* (John Wiley & Sons, second edition, 1984) at page 759, Figure 12.43, a buffer stage for class B (push-pull) operation can be formed by a pair of error operational amplifiers (error op-amps) which are connected to receive feedback from a pair of serially connected output transistors in such a manner as to assure unity voltage gain. The operation is class AB (push-pull) in cases where in the quiescient (no signal) state both output transistors conduct current, but one of them does not conduct any current whenever the input voltage goes outside a narrow range, typically the range of about ±0.5 volt around ground potential. As known in the art, class AB operation in general is desirable from the standpoints of low standby power consumption and of no missing output signals for small input signals (no "dead zone") which would distort the output. Although such a buffer stage has the advantage of an output voltage swing (range) which is fully rail-to-rail (e.g. power supply $V_{DD}$ to power supply $V_{SS}$) and the advantage of a low output impedance, it suffers from the disadvantage that any inequality in the voltage offsets of the operational amplifiers results in an undesirable non-conducting condition of one of the output transistors in the quiescent state, whereby the desired (push-pull) class AB operation is not feasible. Also, the circuit design is undesirably sensitive to semiconductor processing variations, so that either excessive power dissipation or circuit instability (oscillations) caused by poor feedback control over the quiescent current, or both, may result: Too high a quiescent current is wasteful of power, whereas too low a quiescent current can result in the above-mentioned circuit instability. That is, the circuit is not as reliable or robust as is desired.

SUMMARY OF THE INVENTION

A more reliable or robust low impedance buffer stage, which can be operated class AB, in accordance with the invention comprises:
   (a) first and second operational amplifiers each having an output terminal and a first and a second input terminal;
   (b) first and second resistor means;
   (c) first and second transistor devices respectively having first and second relatively high-current-carrying controlled paths (source-drain paths) and respectively having first and second relatively low current carrying control terminals;
   (d) first and second power rails;
   (e) first connection means for connecting, from the first power rail to the second power rail, serially the first high-current path of the first transistor device, the first resistor means, the second resistor means, and the second high-current path of the second transistor device;
   (f) second connection means for connecting a first node located between the first transistor device and the first resistance means to the second input terminal of the first operational amplifier;
   (g) third connection means for connecting a second node located between the second transistor device and the second resistance means to the second input terminal of the second operational amplifier; and
   (h) fourth and fifth connection means for connecting respectively the output terminal of the first operational amplifier and of the second operational amplifier to the control terminal of the first transistor device and of the second transistor device, respectively.

This buffer stage can advantageously be fed by a high voltage gain stage of amplifier circuitry. Also, a pair of serially connected third and fourth transistors, having much higher channel width-to-length ratios than the first and second transistors, can be connected in parallel with the first and second transistors, in order to make the output voltage swing more nearly approximate the rail-to-rail power supply voltage. Furthermore, for full rail to rail output capability, a separate switching transistor is inserted between the first and second rails, respectively, and the first and second transistors; and each such switching transistor has its control terminal respectively connected to the first and second nodes.

BRIEF DESCRIPTION OF THE DRAWINGS

This invention, together with its features, advantages, and characteristics may be better understood from the following detailed description when read in conjunction with the drawing in which the FIGURE is a circuit schematic including a buffer stage in amplifier circuitry.

DETAILED DESCRIPTION

The FIGURE shows a low impedance buffer stage 20 in accordance with the invention. Advantageously this buffer stage 20 is supplied with voltages V1 and V2 by a high voltage gain stage 10. The circuitry of both the stages 10 and 20 can be integrated into a single silicon semiconductor chip, as known in the art and as further discussed below.

In the FIGURE, power lines ("rails") $V_{DD}$ and $V_{SS}$ are set at typically +5 volt dc and −5 volt dc, respectively, as known in the art. A fixed electrical current source of current $I_S$ is connected serially with a resistor $R_S$ and an n-channel MOS transistor M7 between the power rails, in order to form the high gain stage 10. During operation, this high gain stage 10 receives an input voltage $V_{IN}$ at its input terminal 11 and delivers voltages V1 and V2 to the buffer stage 20.

Each of a pair of standard op-amps A1 and A2 (each of which can be formed by a simple differential pair of transistors) is connected in the stage 20, and each of these op-amps has its respective negative input terminal connected to receive the voltages V1 and V2. Serially connected from rail to rail are n-channel MOS transistors M5 and M1, a resistor R1, a resistor R2, and p-channel transistors M2 and M6. A node between the resistors R1 and R2 develops an output voltage $V_{OUT}$ at an output terminal 21 of the stage 20. Optionally, for reasons discussed below, another n-channel MOS transistor M3 and another p-channel MOS transistor M4 are added to the buffer stage 20 in parallel with the branch formed by the serially connected M5, M1, R1, R2, M2 and M6. The transistors M3 and M4 are serially connected from rail to rail. A node between these transistors M3 and M4 is connected to the output terminal 21.

Advantageously, the parameters of the transistors M3 and M4 are selected so as to equalize their transconductances. The channel width to length ratio (W/L) of each of M3 and M4 advantageously is at least about five times as large as that of M1 and M2, respectively. Likewise, advantageously the transistors M1 and M2 are formed with equal transconductances. The resistors R1 and R2 advantageously are a matched pair (R1=R2). The requirements of matched pairs for R1 and R2, as well as for equal transconductances of M1 and M2, M3 and M4, need not be satisfied, at some penalty of signal distortion. Indeed, one of the resistances R1 and R2 could be zero (short circuit).

The purpose of M5 and M6 is to enable full rail-to-rail output voltage swing at the output terminal 21, for such full rail-to-rail operation tends to be prevented by the voltage drop(s) across R1 and R2. For example, because of the voltage drop across R2, the output voltage $V_{OUT}$ cannot attain $V_{DD}$ regardless of how high V2 rises, so long as current can flow through R2. In the presence of M6, however, when V2 rises and causes the potential at the node N2 to rise to a threshold below $V_{DD}$, the transistor M6 turns off, whereby the voltage drop across R2 vanishes and hence the transistor M4 can then bring the output voltage $V_{OUT}$ fully to $V_{DD}$. If, on the other hand, such full rail-to-rail output is not required, then the transistors M5 and M6 can be omitted, with the source terminals of M1 and M2, respectively, being connected directly to $V_{SS}$ and $V_{DD}$.

Each of the op-amps A1 and A2, respectively, has its output terminal coupled (connected) to a low current carrying control terminal (gate terminal) of the pair M1, M3 and the pair M2, M4.

In practice, the op-amps A1 and A2 are biased (not shown) so that there is an adequate safety margin of non-zero quiescent current in a neighborhood of the quiescent state (no signal region), in order to avoid the signal distortion problem otherwise caused by a "dead zone" in which a change in the input signal would not produce any change in the output.

The buffer stage 20 operates as follows. Because the op-amp A1 and A2, being operational amplifiers, cannot support any significant differences in the voltages applied to their positive vs. negative input terminals, the feedback to their positive input terminals supplied by node N1 located between R1 and M1 (to A1) and by node N2 located between R2 and M2 (to A2) makes the quiescent current $i_Q$ well-defined and controlled, i.e., adjustable to the desired value by proper selection of parameters. More specifically, assuming that the source-drain voltage drop across M5 and M6 are both much less than a threshold of n-channel and p-channel transistors, the quiescent current $i_Q$ is given by:

$$i_Q = I_S R_S (1+a)/(R1+R2) \quad (1)$$

where the R's are the resistances of the respective designated resistors, and where a is equal to the ratio of the width-to-length ratio $(W/L)_3$ of M3 to that $(W/L)_1$ of M1, and equally of M4 to M2 (assuming matched pairs of transistors):

$$a = (W/L)_3/(W/L)_1 = (W/L)_4/(W/L)_2 \quad (2)$$

Note that from eq. (1) it follows the quiescent current $i_Q$ is thus well-controllable and insensitive to semiconductor processing variations: the resistances of the resistors track one another, as do the W/L ratios. Although the current $I_S$ supplied by the current source varies with semiconductor processing conditions, it does so in a well-defined non-critical way, so that the quiescent current is relatively stable with respect to variation in semiconductor processing conditions: the feedback in the operational amplifiers does not introduce any significant circuit instability.

By selecting R1=R2=R, then, in the quiescent state:

$$V_{OUT} = (V_1 + V_2)/2; \quad (3)$$

i.e., the output voltage of the buffer stage 20 then is conveniently equal to the common mode voltage of the inputs V1 and V2 to this buffer stage.

As noted above, the transistors M3 and M4, as well as M6 and M5, can be omitted, but then during class AB operation (push-pull) the output voltage $V_{OUT}$ could not swing as closely from $V_{DD}$ to $V_{SS}$ as it can when these transistors are present. Note that the larger the value of a, as given by eq. (2), the closer the output voltage swing becomes equal to rail to rail.

In order to assure stable operation with sufficient quiescent current, and hence to assure class AB operation, $I_S$ and $R_S$ should be selected to be large enough to make $I_S R_S$ greater than the sum of the maximum expected absolute values of the operational amplifier offset voltages of A1 and A2 by a factor of about 5 to about 10 or more, lest chip-to-chip variations of the offset in A1 or A2 or both should cause undesirably large chip-to-chip variations in the quiescent current $i_Q$.

The resistors $R_1$, $R_2$, $R_S$ can be formed, for example, by standard diffused regions in semiconductor or by standard deposited polysilicon resistors. The current source $I_S$ can be formed by an MOS transistor biased in its saturation region, as known in the art.

Note that in the presence of signal applied to the gate terminal of M7, the voltage drop (V2−V1) across $R_S$ remains fixed ($I_S R_S$). That is, the difference mode (V2−V1)/2 is fixed; whereas the common mode (V2+V1)/2 varies with signal.

In a typical case, only by way of illustration, approximate values for the various parameters are:

R1=R2=2000 ohm; $R_S$=1000 ohm; $I_S$=50 microamp; a=30.

With signal, the output current at the output terminal 21 can go as high as 10 milliamp.

The gate terminal of M7, to which $V_{IN}$ is applied, can be connected, for example, to the output terminal of a differential gain stage (not shown); and the output terminal 21 of the stage 20 can then be connected, for the purpose of feedback, to the negative input terminal of the differential gain stage. In that way, overall unity gain of $V_{OUT}$ relative to the input voltage applied to a positive input terminal of the differential gain stage can be achieved, in combination with overall high input impedance and low output impedance, as is desired in amplifier circuitry for driving large currents into large loads (line drivers).

Although the invention has been described in detail in terms of a specific embodiment, various modifications can be made without departing from the scope of the invention. For example, instead of n-channel and p-channel MOS transistors, npn and pnp bipolar transistors can be used.

I claim:

1. Amplifier circuitry including a buffer stage which comprises
   (a) first and second operational amplifiers each having an output terminal and a first and a second input terminal;
   (b) first and second resistance means;
   (c) first and second transistor devices respectively having first and second relatively high current carrying controlled paths and respectively having first and second relatively low current carrying control terminals;
   (d) first and second power rails;
   (e) first connection means for connecting, from the first power rail to the second power rail, serially the first high current path of the first transistor device, the first resistance means, the second resistance means, and the second high current path of the second transistor device;
   (f) second connection means for connecting a first node located between the first transistor device and the first resistance means to the second input terminal of the first operational amplifier;
   (g) third connection means for connecting a second node located between the second transistor device and the second resistance means to the second input terminal of the second operational amplifier; and
   (h) fourth and fifth connection means for connecting respectively the output terminal of the first operational amplifier and of the second operational amplifier to the control terminal of the first transistor device and of the second transistor device, respectively.

2. The circuitry of claim 1 which further comprises fourth connection means for connecting a node located between the first and second resistance means to an output terminal of the buffer stage.

3. A semiconductor integrated circuit including the amplifier circuitry recited in claim 1.

4. Amplifier circuitry in accordance with claim 1 which further comprises:
   third and fourth transistor devices having respectively third and fourth relatively low current carrying control terminals that are coupled respectively to the first and second control terminals of the first and second transistor devices, respectively,
   the third and fourth transistor devices having respectively third and fourth relatively high current paths that are connected serially from the first power rail to the second power rail.

5. A semiconductor integrated circuit in accordance with claim 4 in which the channel width to length ratio of the third transistor device and of the fourth transistor device is at least five times greater than that of the first transistor device and of the second transistor device, respectively.

6. A circuit in accordance with claim 4 further comprising fifth and sixth transistor devices whose high current paths are respectively connected in series with that of the first and second transistor devices, and whose control terminals are respectively connected to the first and second nodes.

7. A semiconductor integrated circuit including the circuitry recited in claim 6.

8. In a semiconductor integrated circuit, the circuitry recited in claim 4.

9. Amplifier circuitry in accordance with claim 1 further including a voltage gain stage having first and second output terminals that are connected to the first input terminal of the first and second operational amplifiers, respectively, the voltage gain stage comprising
   (a) current source means for supplying a constant current;
   (b) third resistor means having first and second terminals;
   (c) a seventh transistor device having a control terminal that is connected to a circuitry input terminal for receiving an input signal voltage, the seventh transistor device having a high current path suitable for carrying the constant current;
   (d) connecting means for connecting, from the first rail to the second rail, serially the current source means, the third resistor means, and the seventh transistor device; and
   (e) connecting means for connecting the first and second terminals of the resistance means to the first input terminal of the first and second operational amplifiers, respectively.

10. In a semiconductor integrated circuit, the amplifier circuitry of claim 9.

11. Amplifier circuitry according to claim 4 further including:
   (a) current source means for supplying a constant current;
   (b) third resistance means having first and second terminals;
   (c) a seventh transistor device having a control terminal that is connected to a circuitry input terminal for receiving an input signal voltage, the seventh transistor having a high current path suitable for carrying the constant current;
   (d) connecting means for connecting, from the first rail to the second rail, serially the current source means, the third resistance means, and the seventh transistor device; and
   (e) connecting means for connecting the first and second terminals of the third resistance means to the first input terminal of the first and second operational amplifiers, respectively.

12. In a semiconductor integrated circuit, the amplifier circuitry of claim 11.

13. The amplifier circuitry of claim 9 in which the constant current multiplied by the resistance of the third resistance means is at least about 5 times the input offset voltage of the first and second operational amplifiers.

* * * * *